United States Patent
Ghosh et al.

(10) Patent No.: US 11,394,175 B2
(45) Date of Patent: Jul. 19, 2022

(54) VCSEL NARROW DIVERGENCE PROXIMITY SENSOR

(71) Applicant: Princeton Optronics, Inc., Mercerville, NJ (US)

(72) Inventors: Chuni Ghosh, West Windsor, NJ (US); Jean-Francois Seurin, Princeton Junction, NJ (US)

(73) Assignee: Princeton Optronics, Inc., Mercerville, NJ (US)

( * ) Notice: Subject to any disclaimer, the term of this patent is extended or adjusted under 35 U.S.C. 154(b) by 202 days.

(21) Appl. No.: 16/470,899

(22) PCT Filed: Dec. 28, 2017

(86) PCT No.: PCT/US2017/068714
§ 371 (c)(1),
(2) Date: Jun. 18, 2019

(87) PCT Pub. No.: WO2018/128904
PCT Pub. Date: Jul. 12, 2018

(65) Prior Publication Data
US 2020/0127441 A1 Apr. 23, 2020

Related U.S. Application Data

(60) Provisional application No. 62/443,402, filed on Jan. 6, 2017.

(51) Int. Cl.
*H01S 5/187* (2006.01)
*G01S 17/04* (2020.01)
(Continued)

(52) U.S. Cl.
CPC ............. *H01S 5/187* (2013.01); *G01S 17/04* (2020.01); *H01S 3/08068* (2013.01);
(Continued)

(58) Field of Classification Search
None
See application file for complete search history.

(56) References Cited

U.S. PATENT DOCUMENTS

| | | | |
|---|---|---|---|
| 2004/0001046 A1* | 1/2004 | Chen | G06F 3/0317 345/163 |
| 2007/0071056 A1* | 3/2007 | Chen | G01S 17/87 372/50.124 |

(Continued)

FOREIGN PATENT DOCUMENTS

| | | |
|---|---|---|
| WO | 2016010481 A1 | 1/2016 |
| WO | 2016/191717 | 12/2016 |

OTHER PUBLICATIONS

European Patent Office Supplementary Partial Search Report for Application No. EP17889633 dated Nov. 28, 2019 (5 pages).
(Continued)

*Primary Examiner* — Hovhannes Baghdasaryan
(74) *Attorney, Agent, or Firm* — Michael Best & Friedrich LLP

(57) ABSTRACT

A proximity sensor which uses very narrow divergent beams from Vertical Cavity Surface Emitting Laser (VCSEL) for the illumination source is disclosed. Narrow divergent beams in the range 0.5 to 10 degrees can be achieved to provide high proximity sensing accuracy in a small footprint assembly. One approach to reducing the beam divergence is to increase the length of the VCSEL resonant cavity using external third mirror. A second embodiment extends the length of the VCSEL cavity by modifying the DBR mirrors and the gain region. Optical microlenses can be coupled with the VCSEL to collimate the output beam and reduce the beam divergence. These can be separate optical elements or integrated with the VCEL by modifying the substrate output surface profile or an added a transparent layer. These methods of beam divergence reduction are incorporated into (Continued)

various embodiment configurations to produce a miniature proximity sensor suitable for cell phones and tablets.

16 Claims, 11 Drawing Sheets

(51) Int. Cl.
  *H01S 3/08* (2006.01)
  *H01S 5/14* (2006.01)
  *H01S 5/183* (2006.01)
  *H01S 5/30* (2006.01)
  *H01S 5/02257* (2021.01)
  *H01S 5/02325* (2021.01)

(52) U.S. Cl.
  CPC ...... *H01S 5/02257* (2021.01); *H01S 5/02325* (2021.01); *H01S 5/141* (2013.01); *H01S 5/18305* (2013.01); *H01S 5/18361* (2013.01); *H01S 5/18388* (2013.01); *H01S 5/3095* (2013.01)

(56) References Cited

U.S. PATENT DOCUMENTS

| | | |
|---|---|---|
| 2010/0134803 A1 | 6/2010 | Baier et al. |
| 2013/0194787 A1* | 8/2013 | Geske ................ G01S 7/4815 362/157 |
| 2015/0212208 A1 | 7/2015 | Hanada et al. |
| 2015/0260830 A1* | 9/2015 | Ghosh ................ G01S 17/04 250/208.1 |
| 2015/0311673 A1 | 10/2015 | Wang et al. |
| 2015/0318924 A1* | 11/2015 | Motohara ............ G02B 6/4279 398/200 |
| 2015/0362585 A1 | 12/2015 | Ghosh et al. |
| 2017/0153319 A1* | 6/2017 | Villeneuve .......... H01S 3/08086 |

OTHER PUBLICATIONS

ISA/KR, International Search Report for PCT/US2017/068714 (dated Apr. 24, 2018).

* cited by examiner

VCSEL NARROW DIVERGENCE PROXIMITY SENSOR

CROSS-REFERENCE TO RELATED APPLICATION(S)

This application claims the benefit of U.S. Provisional Patent Application No. 62/443,402, filed Jan. 6, 2017, the contents of which are incorporated herein by reference in their entirety.

FIELD OF DISCLOSURE

The present invention relates to improving and miniaturizing proximity sensing and element identification devices using an optical illumination source comprising very low divergence Vertical Cavity Surface Emitting Lasers (VCSEL) coupled with one or more optical detectors.

BACKGROUND

Typical methods for proximity or distance detection of objects involve illuminating an object with a light source, such as an LED, and measuring the intensity of the light reflected back to a detector located near the source. The reflected light intensity at the detector reduces as the object is moved further away from the light source and detector. The method relies on good object illumination from an intense well collimated optical source as well as known reflectance of the objects. Differences in reflectance and even shapes of objects tend to change the detected light resulting in errors in distance measurement. The sources currently available for a reasonable cost have low intensity and/or are highly divergent which limits the distance that can be accurately measured because the reflected intensity is low at greater distances and becomes below the detection limit of the detector or is indistinguishable from ambient light levels.

Improved sensitivity has been accomplished by using complex optical systems using multiple lenses, or multiple source wavelengths and filters. Another approach has been to use a pulsed source so that ambient noise levels can be measured during the intervening period between pulses. This significantly limits the time response of the sensor. These improvements add major cost and complexity to the proximity sensor.

The advent of mobile phones and similar tablet computers has created the need for accurate distance sensing for camera auto-focus applications and other similar systems. The sensor has to be miniaturized to be compatible with the compact nature of the mobile phones. This creates problems because it puts the optical detector close to the optical source. With a divergent source reflections from the protective window can propagate back to the detector severely limiting the object distance detection limit of the sensor. The increasing complexity of the mobile phone camera systems is demanding more accurate proximity sensors while maintaining or even reducing further the miniature footprint.

SUMMARY

This disclosure describes proximity sensors that use very narrow divergent beams from a Vertical Cavity Surface Emitting Laser (VCSEL) for the illumination source. A VCSEL produces lower divergent beams than a light emitting diode or other non-coherent sources. Improved proximity sensors have been developed taking advantage of the reduced divergence of the VCSEL output beam. Nevertheless, the divergence of the standard VCSEL is typically 15 degrees, full width half maximum, and this can limit the sensitivity of such proximity sensors.

In accordance with one aspect, the disclosure describes an optical sensor module that includes an optical source including a VCSEL device operable to generate a narrow divergence source beam directed through a window toward an object, the narrow divergence source beam having a full-width half-maximum beam divergence of no more than 10 degrees. The module further includes an optical detector to sense light reflected back from the object illuminated by the narrow divergence source beam, and a computation device operable to determine a distance to the object or a physical characteristic of the object based at least in part on a signal from the optical detector.

Embodiments of the invention provide much narrower divergent beams in the range of 0.5 to 10 degrees to provide much higher proximity sensing accuracy in a smaller footprint assembly. Some implementations obtain the extension of the VCSEL resonant cavity using external third mirror. The increased cavity length results in higher power in fewer larger diameter transverse modes which significantly reduces the output beam divergence. The third mirror can be a separate element or be integrated with the VCSEL device substrate.

Other embodiments describe other approaches to extending the length of the VCSEL cavity by modifying the DBR mirrors and gain region. Optical microlenses can be coupled with the VCSEL to collimate the output beam so reducing the beam divergence. These can be separate optical elements or integrated with the VCEL by modifying the substrate output surface profile or an added a transparent layer.

These methods of beam divergence reduction are incorporated into various configurations for the proximity sensor. One of these is a VCSEL with a detector closely adjacent to it located such that any reflections from the protective window above do not fall on the detector due to the very low beam divergence. Locating the detector close to the axis of the VCSEL beam results in higher reflected intensity than would occur if the detector was further away since the highest reflected intensity from an object tends to be direct back-reflection (and backscattered light which follows the Lambertian law).

Other embodiments enable the detector to be placed even closer to the VCSEL incorporates a vertical baffle to block any light being reflected from the window back onto the detector.

Although the descriptions have been made about proximity sensing of objects for applications such as self-focusing of cameras and other motion detection there are other applications of the technology. The very low divergence VCSEL source beam can be used for health monitoring by measuring blood flow, heart pulse rate and chemical composition of blood and tissues etc. In these applications the source beam is directed at the sample or object and the detector measures the quantity of reflected light at one or more wavelengths or the fluctuation of reflected light which correlates with pulsing effects.

The disclosure also describes a handheld computing device (e.g., a smart phone or tablet) that includes a window and an optical sensor module. The module includes an optical source including a VCSEL device operable to generate a narrow divergence source beam directed through the window toward an object external to the handheld computing device, the narrow divergence source beam having a full-width half-maximum beam divergence of no more than 10 degrees. The module also includes an optical detector to sense light reflected back from the object that is illuminated by the narrow divergence source beam, and a computation device operable to determine a distance to the object or a physical characteristic of the object based at least in part on a signal from the optical detector.

Other aspects, features and advantages will be readily apparent from the following detailed description, the accompanying drawings and the claims.

DETAILED DESCRIPTION

Various aspects of this disclosure representing a broad framework of the principles will be described using exemplary embodiments that are represented in different drawing figures. For clarity and ease of description, each embodiment includes only a few aspects. However, different aspects presented in each embodiment may be practiced separately or in various combinations. Many different combinations and sub-combinations of the representative embodiments within the broad framework presented in this written specification, may be apparent to those skilled in the art but not explicitly shown or described, should not be construed as precluded.

Figure 1:
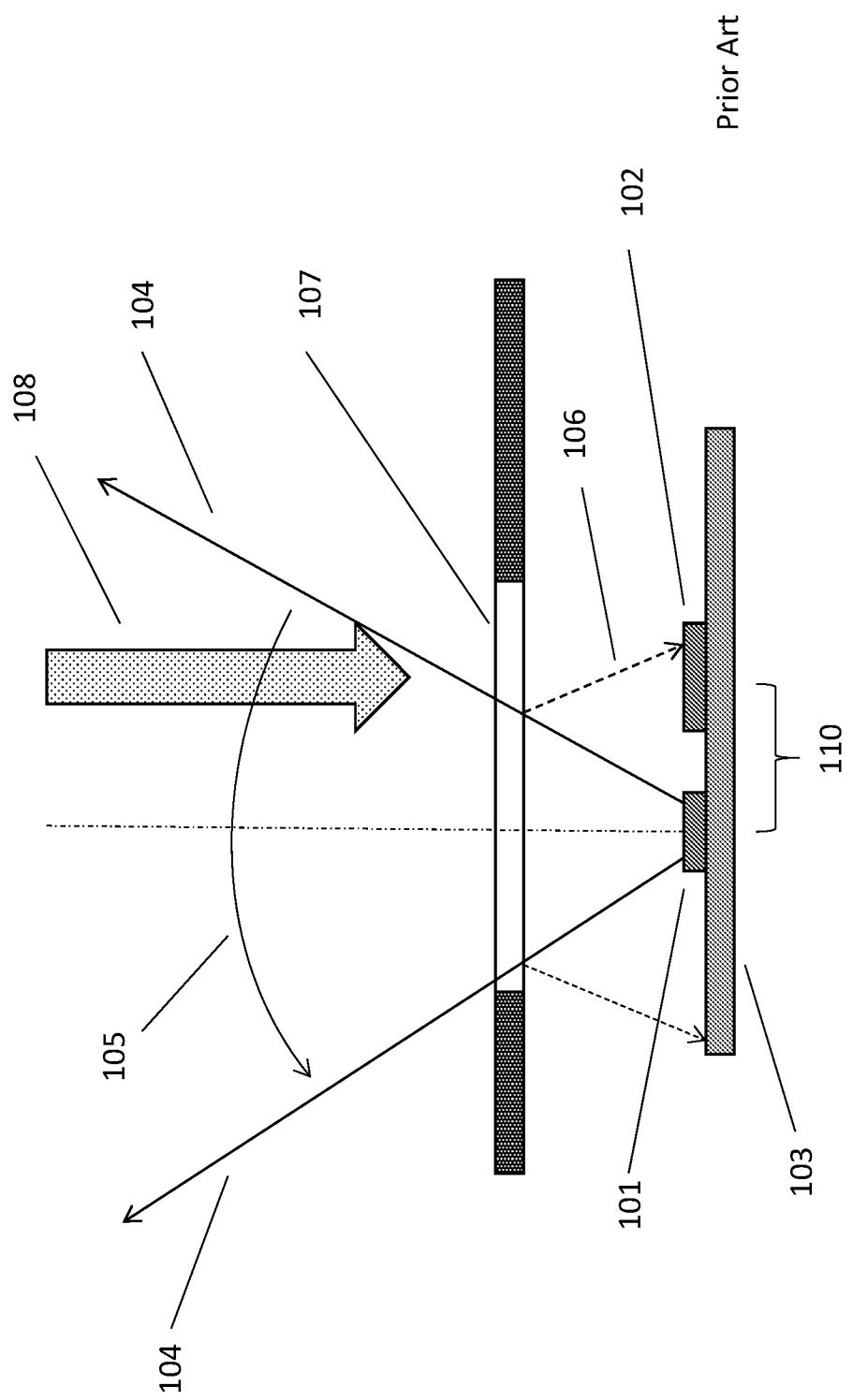
FIG. 1 shows a state of the art proximity sensor which uses a light source with standard divergence properties.

The drawing in FIG. 1 shows the optical layout for a proximity sensor using the standard VCSEL source 101 or other light emitting element. The output beam 104 has a typical full width half maximum divergence 105 of 15 degrees or more. The output beam travels into the scene and light is reflected 108 by an object at a certain distance out. This light can be scattered in many directions depending on the surface properties of the object. A portion of this light 108 is reflected back onto the optical detector 102 which is mounted on a common submount 103 with the source. The detector signal is sent to a computation device which determines the distance of the object from the sensor based on the intensity of the reflected light. The computer also monitors the source parameters so that signals from the detector can be calibrated with the source power providing maximum sensor accuracy. It should be noted that the source can be operated continuous wave (CW) or pulsed depending on the particular application.

A window 107 is placed above the VCSEL and detector to protect the components from the environment. The sensor is typically used in indoor or outdoor environments and the window protects the components from damage from objects and liquids etc. The window will normally have an anti-reflection coating applied to it however the coating is not perfect and some portion of the VCSEL beam will be specularly reflected 106 from it. This reflected beam will fall onto the detector generating a signal. This signal will add to the signal generated by the reflected beam 108 and result in errors in the distance determinations. This problem can be alleviated by moving the detector further away from the VCSEL and providing separate windows. However, this will greatly increase the size and complexity of the proximity sensor.

Figure 2:
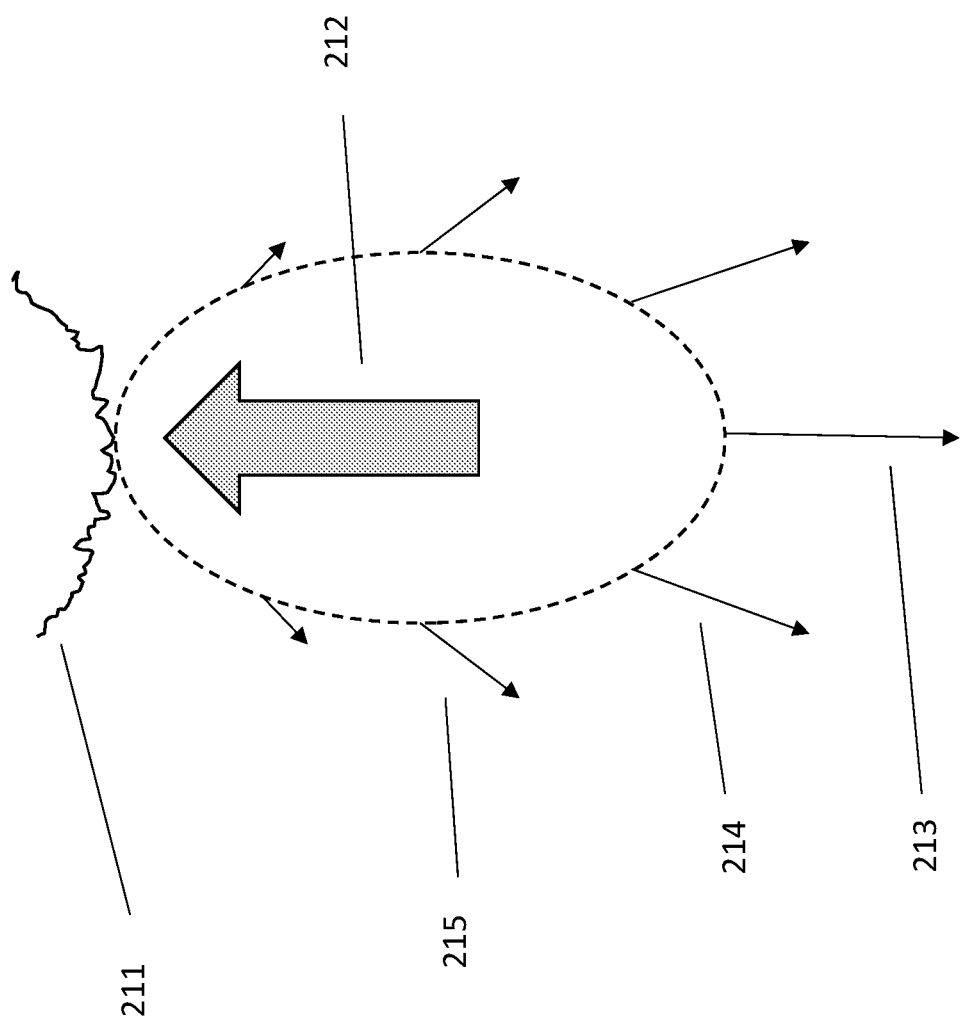
FIG. 2 describes the optical characteristics of light scattered and reflected from an object indicating the maximum intensity is typically in the back direction close to the normal of the incident light for specular reflectance. The reflected light from a diffusely scattering or rough surface follow the Lambertian law which states that the light intensity is proportional to the cosine of the angle from the normal of the incident light.

Separating the detector and sensor will also typically reduce the intensity of the back-reflected light from an object thereby reducing the sensitivity of the proximity sensor. This is explained in FIG. 2. The object will have an indeterminate surface 211 which can vary from highly reflective to diffusively scattering and all combinations and variations in between, depending on the particular object. The incident beam 212 will be incident on the object and will be typically large enough to cover most of the object surface facing the sensor. The reflections of the beam from the surface will occur in different directions and with different intensities. Typically for most surfaces the reflections in the back direction 213 will have the highest intensity. The reflections 214, 215 in other directions will usually be lower in intensity. Thus for maximum sensitivity and accuracy the detector needs to be positioned to capture the most backscattered light.

Figure 3:
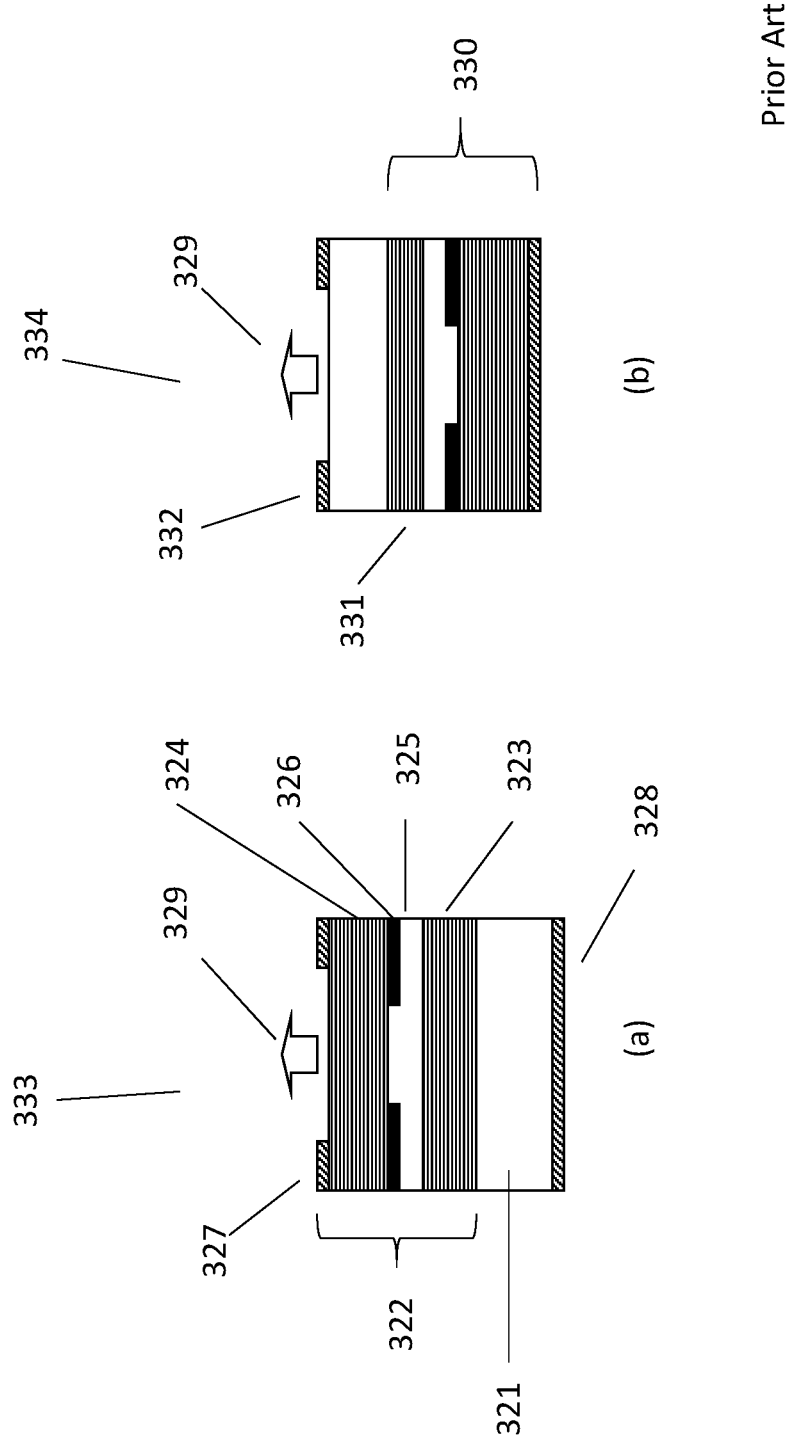
FIG. 3 describes the two major types of VCSEL structure, namely top emitting where the VCSEL structure is on top of the substrate and bottom emitting where the VCSEL structure is on the bottom and the output beam is transmitted through the substrate.

The design of a typical standard top emitting VCSEL 333 is shown in FIG. 3a. The VCSEL structure 322 is grown epitaxially on a substrate 321. The VCSEL resonant cavity is formed between two DBR mirrors 323 and 324. A laser gain section comprising a group of multiple quantum wells is located 325 in between the DBR mirrors. The gain section is activated by applying a current to electrodes 327 and 328. An aperture is formed in the gain region to restrict the current to the central region increasing the current density to obtain high gain. This results in laser oscillation between the mirrors and the top DBR mirror is made partially transmitting resulting in an output beam 329 in the upward direction.

The design of a bottom emitting version of the VCSEL 334 is described in FIG. 3b. In this layout the VCSEL structure is grown on the substrate with the partial reflecting DBR 331 located on the substrate side. In this case the output beam is transmitted through the substrate 329. In either configuration the cavity length is short, being only a few wavelengths long, and determined by the distance between the DBR mirrors typically half wavelength and the DBR structure. As a consequence the lasing mode diameter is small giving a relatively large divergence beam, typically 15 degrees FWHM. The beam diameter can be increased and more power generated by increasing the aperture diameter however this results in multimode operation and the divergence does not become lower.

Figure 4:
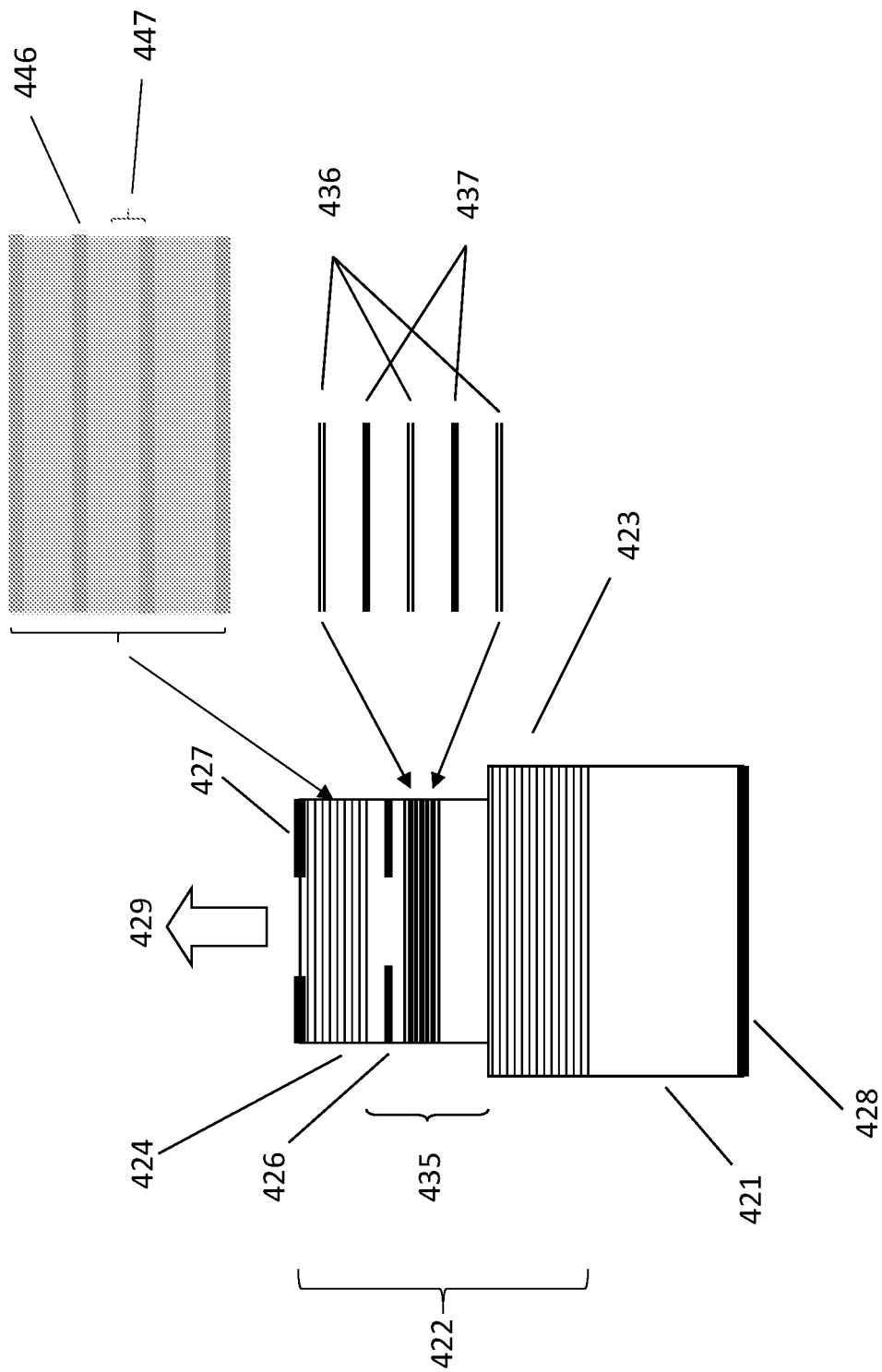
FIG. 4 shows methods for increasing the cavity length in a VCSEL by increasing the length of the gain region.

There are several methods to reduce the divergence of the VCSEL output beam either by modifying the VCSEL configuration or by adding optical elements to modify the beam characteristics. One method to modify the VCEL configuration and increase its cavity length is shown in FIG. 4. In this VCSEL structure 422 the gain section 435 is increased in length by using multiple gain sections 437 instead of just one gain section group of multiple quantum wells. Each gain section is separated from each other by tunnel junction diodes 436. Each gain section is placed at the maximum intensity point of the resonant cavity standing wave so that the cavity length increases in half wavelengths by the number of added gain sections. More details about using multiple gain sections can be learned in the United States Patent Application No. 20150311673 A1 authored by Q. Wang et al. and published on Oct. 29, 2015, and co-owned by Princeton Optronics Inc. Mercerville, N.J. That description is being incorporated by reference herein. The resulting VCSEL device using this structure has a lower divergent beam because of the longer cavity as well as it being higher intensity because of the higher gain from the multiple gain sections.

In one approach, the cavity length 422 can be extended by increasing the number of DBR mirrors 446 in the DBR stack 424 by using lower contrast between the mirrors 447 by reducing the band gap difference of the two materials making the DBR mirrors. For example in GaAs/GaAlAs DBRs, reducing the Al concentration will need larger number of mirror pairs 447 for the desired reflectivity and thus will increase the cavity length. The increase of cavity length will reduce the number of higher order modes and thus reduce the divergence angle. In some implementations, the VCSEL device includes a DBR mirror stack having a length in a range of 6-15 µm. Further, in some instances, the DBR mirror stack includes multiple DBR mirror pairs composed of alternating layers of different materials having a refractive index difference in a range of 1-7%.

Figure 5:
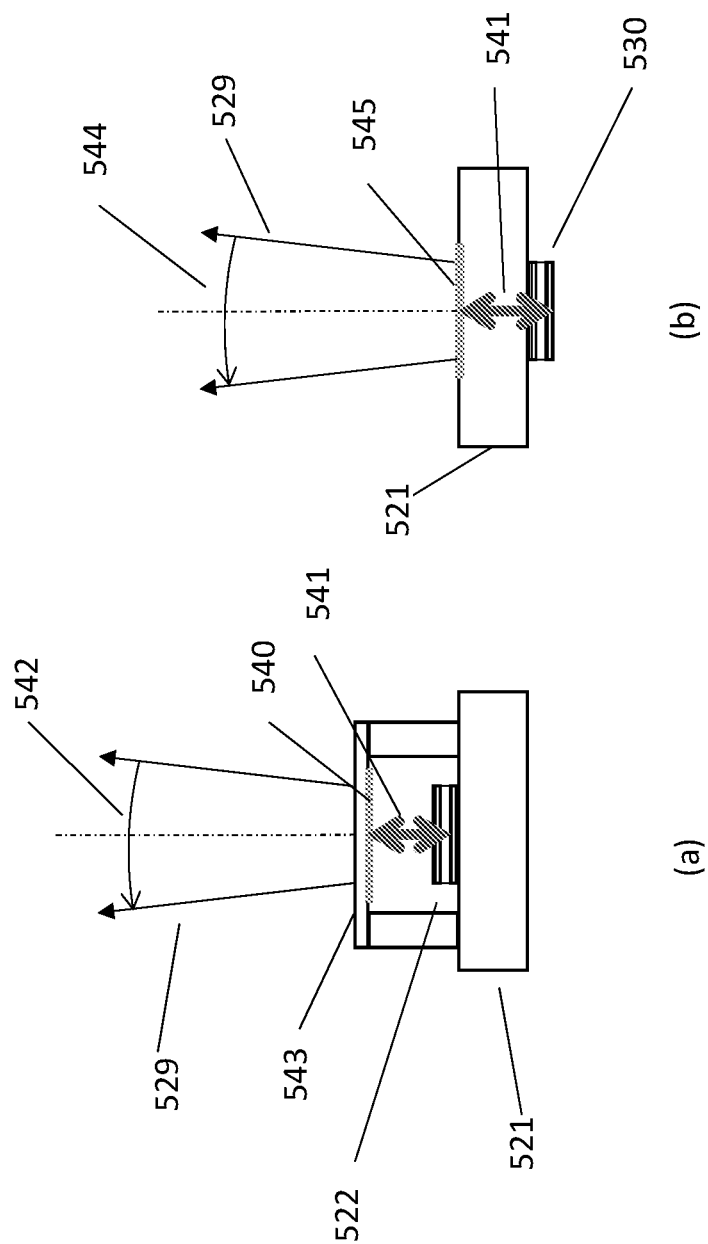
FIG. 5 describes techniques for increasing the VCSEL cavity length using a third mirror in external or extended configurations.

Other methods of reducing the beam divergence by increasing the VCSEL cavity length are described in FIGS. 5a and b. FIG. 5a shows the use of a third mirror 543 external to the VCSEL top emitting structure 522. The VCSEL output DBR mirror reflectivity is reduced so that when activated the VCSEL does not lase. A third mirror 543 with a partial reflection coating 540 is aligned to the VCSEL cavity and with this extra combined reflectivity with the output DBR mirror the VCSEL starts lasing. The VCSEL laser cavity is now defined by the length of the cavity between the VCSEL bottom mirror and the external mirror coating 540. This method can significantly reduce the beam divergence 542 to FWHM values of 0.5 degrees or less.

A more integrated version of the third mirror cavity is described in FIG. 5b. In this arrangement the third mirror distance is extended by depositing the third mirror coating 545 on the opposite side of the substrate 521 to the VCSEL structure 530. In this bottom emitting VCSEL structure 530 the reflectivity of the bottom mirror at the substrate side is reduced so that without the third mirror it does not lase. Again significant reduction in beam divergence 544 is obtained by virtue of the increased effective VCSEL resonant cavity length. The thickness of the substrate can be increased by using thicker semiconductor material such as GaAs on which epitaxial wafer is grown or by bonding another transparent material such as glass etc to increase the thickness of the substrate.

Figure 6:
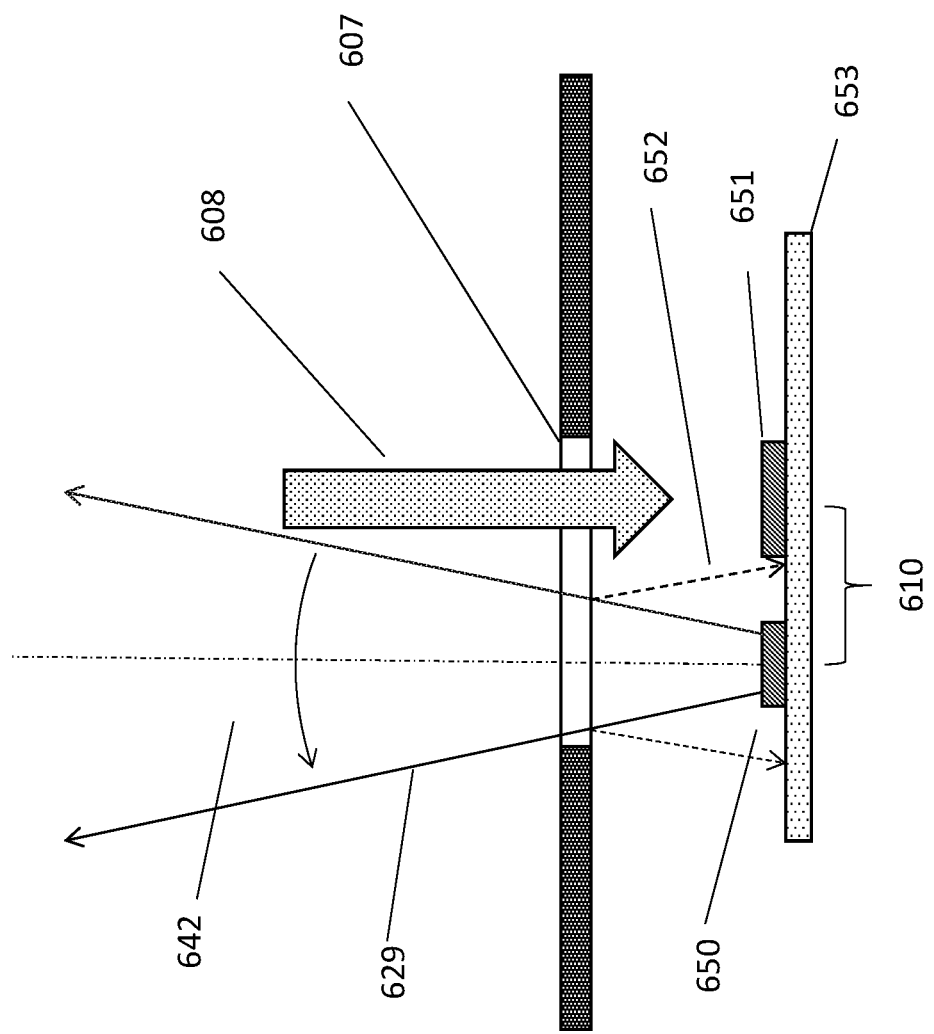
FIG. 6 is a schematic optical diagram of a proximity sensor using a narrow beam divergent VCSEL source. It shows the detector close to the VCSEL and not being affected by window reflections from the VCSEL beam.

The application of low beam divergence VCSEL source for the proximity sensor is shown in FIG. 6. The VCSEL 650 and detector 651 are mounted close together 610 on a common substrate 653. The VCSEL beam propagates out through the window 607 and reflects and scatters off the object. The backscatter radiation 608 returns through the window and is captured by the detector 651. The signal intensity from the detector is used to determine the distance of the object from the sensor. The VCSEL beam divergence is sufficiently small that the specular reflection 652 from the window 607 returns close to the VCSEL and does not fall on the detector. Thus this reflection does not add a noise signal to modify the backscatter signal received by the detector and so does not degrade the distance determination.

Additional benefits are obtained from using the low divergence beam from the VCSEL. The beam that impinges on the object is smaller resulting in much higher incident power density. Therefore, the scattered and reflected power is proportionally higher. This results in improved distance measurement resolution with shorter pulses as well as the ability to measure longer distances. All this is accomplished in a small footprint since a small distance between the VCSEL and detector can be maintained.

Figure 7:
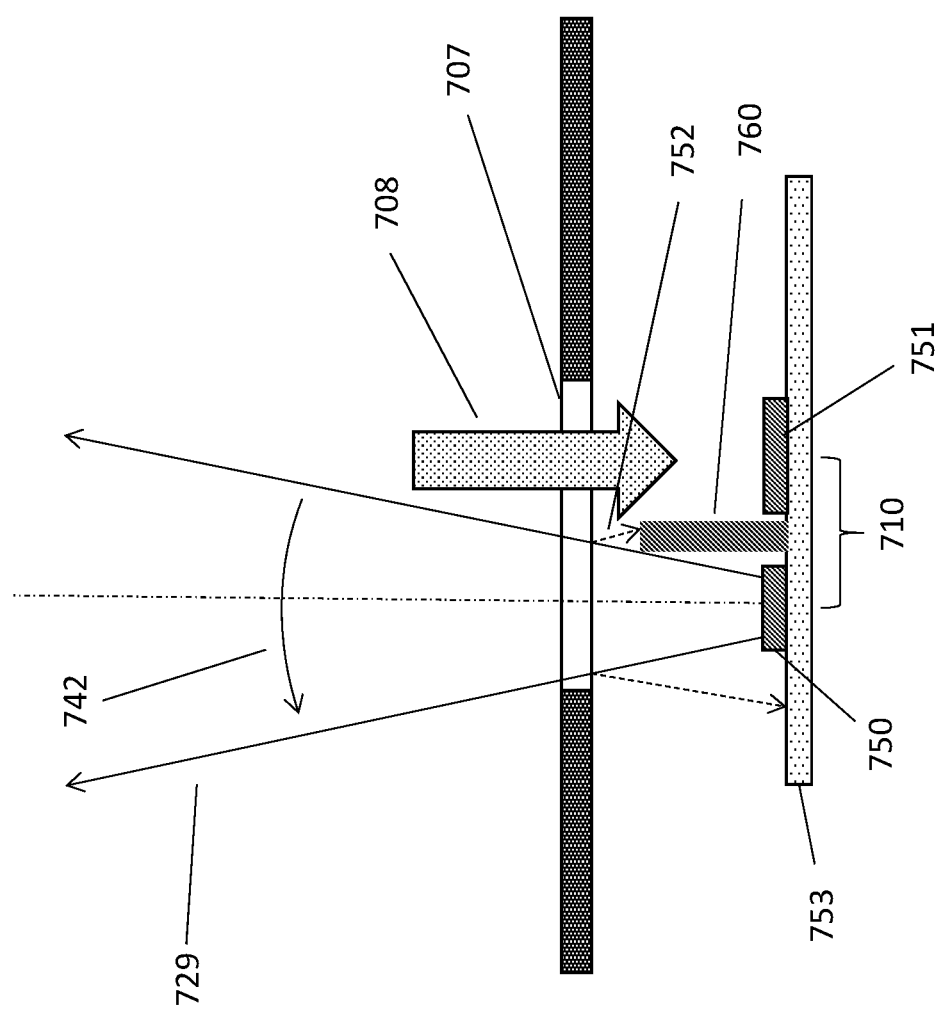
FIG. 7 shows the proximity sensor with a baffle being used to further improve the detector isolation allowing it to be moved even closer to the VCSEL source.

There will be applications which require even smaller footprint for the proximity sensor. One method for achieving this is to add a baffle component between the VCSEL and the detector to block any specular reflection of the VCSEL beam from the detector. FIG. 7 gives an example of using a baffle 760 for this purpose. The baffle 760 is mounted between the VCSEL 750 and the detector 751. The specular reflection 752 from the window 707 is blocked and does not reach the detector 751. The VCSEL and detector can now be placed closer 710 together to obtain a smaller footprint. The baffle does not interfere with the backscatter radiation 708 from the object reaching the detector and so the sensor resolution and distance measuring ability are not compromised.

Figure 8:
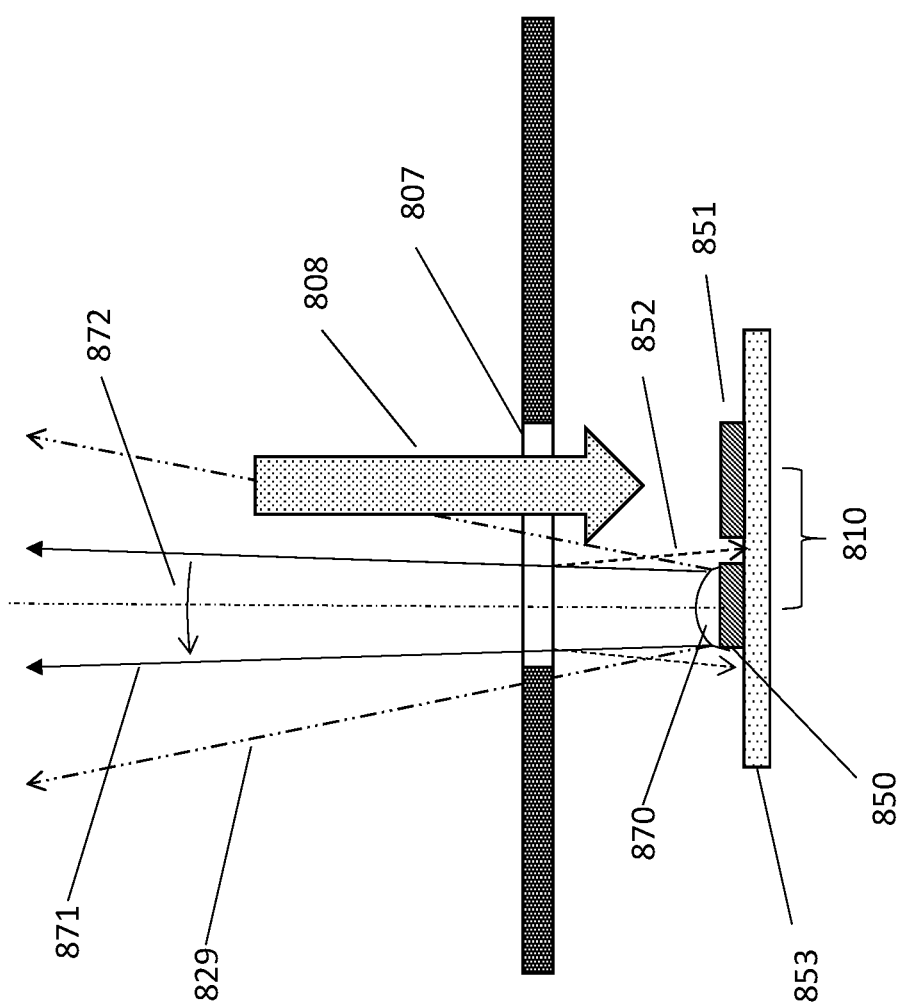
FIG. 8 describes the use of a microlens with the VCSEL to collimate the output beam obtaining very low divergence.
Figure 9:
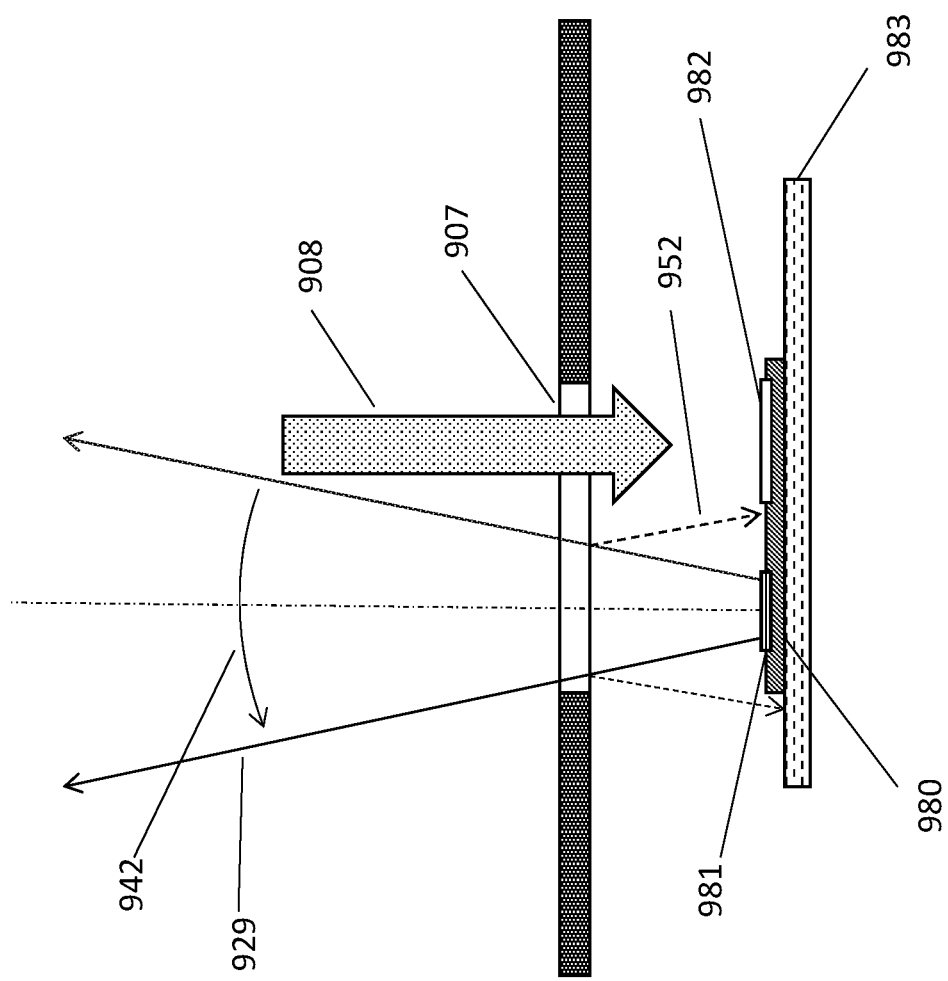
FIG. 9 shows the VCSEL and detector integrated and fabricated on the same substrate.

Another method for reducing the divergence of a beam from a VCSEL 850 is to mount a converging microlens in front of it as shown in FIG. 8. The microlens 870 converges the diverging beam 829 from the VCSEL and collimates it to a very low divergence 872 collimated beam 871. The microlens can be a separate element or it can be integrated with the VCSEL, as shown in the figure. One approach is to deposit a transparent layer on the VCSEL and form in it a spherical convex profile shape or diffractive element centered on the VCSEL axis. Another method which is more appropriate for bottom emitting VCSELs is to form a convex lens profile or diffractive structure in the substrate aligned with the VCSEL output beam. More details about using an integrated lens in the VCSEL substrate can be learned in the U.S. Pat. No. 6,888,871 authored by Kaiyan Zhang et al. and published on May 3, 2005, and co-owned by Princeton Optronics Inc. Mercerville, N.J. That description is being incorporated by reference herein. Using this method a well collimated VCSEL beam can be formed and the specular reflection from the window stays very close to the VCSEL. The detector can be mounted very close to the VCSEL without encountering the window reflection resulting in a very compact proximity sensor module Developing these various methods for producing a compact sensor enables the consideration of integrating the VCSEL and detector in the same substrate. This is described in FIG. 9. The VCSEL structure 981 and detector structure 982 are fabricated in the common substrate 980. Since the VCSEL and detector can be located close together it realizes a small low cost semiconductor chip. This can then be mounted on a ceramic submount or even mounted directly on a printed circuit board 983. Integrating the two components into a single component simplifies the sensor module assembly, reduces the footprint even further and results in major cost savings.

Figure 10:
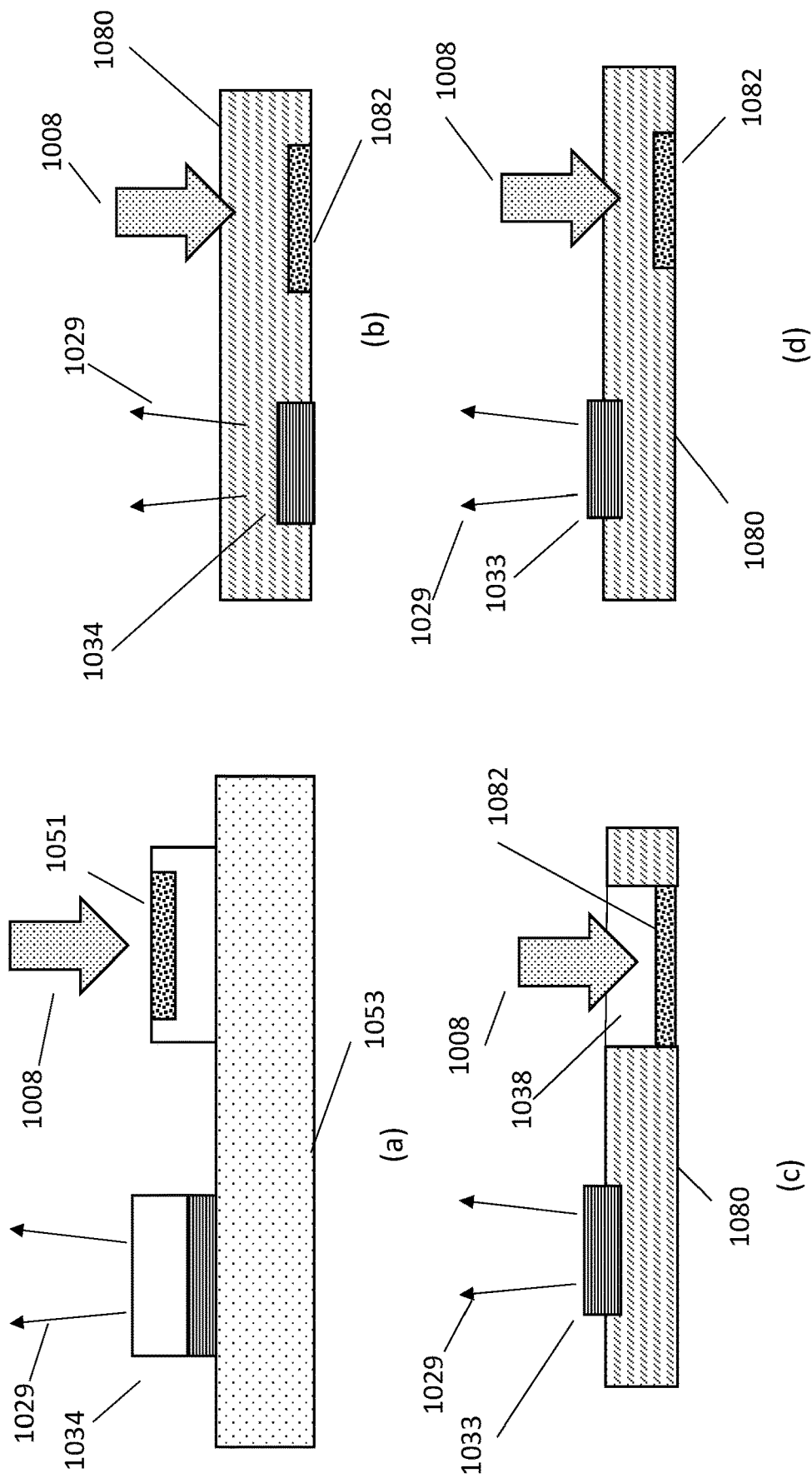
FIG. 10 describes four embodiments for combining or integrating the detector with the VCSEL source into a single module. (a) shows the VCSEL and detector mounted on a common submount, (b) shows a bottom emitting VCSEL and a detector fabricated in the same common substrate, (c) gives the layout for a top emitting VCSEL and detector fabricated in a common substrate. The detectors in (b) and (d) are fabricated in the bottom side of the substrate and the light is transmitted through the substrate. (c) shows the layout for a top emitting VCSEL and a detector fabricated in the bottom side of a common substrate wherein a via or trench is etched through the substrate for transmitting radiation to the detector which otherwise would be absorbed by the substrate.

Several methods for integrating the VCSEL and detector are shown in FIG. 10. In one approach (a), the VCSEL can be a bottom emitting VCSEL 1034 mounted on the substrate 1053 and emits a narrow beam 1029 through its substrate. The detector 1051 can be mounted on the substrate 1053 to detect the return radiation 1008. In another configuration (b), the detector 1082 can be monolithically fabricated on the bottom of the VCSEL substrate 1080. In this configuration the narrow VCSEL beam is output 1029 through the substrate 1080 and the return radiation 1008 detected after passing through the substrate 1080.

In a third configuration (c), the VCSEL 1033 can be top emitting, but the detector 1082 can be fabricated on the other side of the substrate 1080 and the return radiation 1008 can be transmitted through the substrate to the detector by drilling a via hole 1038. Alternately the wavelength would be so chosen that the return radiation 1008 will transmit through the substrate to the detector 1082, as shown in (d). In such cases the specular reflection from the window can be blocked by keeping the VCSEL and the detector at different heights.

Another embodiment to make the assembly of proximity sensor simpler and reduce the manufacturing cost is to fabricate the VCSEL and detector chip with all the electrical contacts on the same bottom side. In this configuration the chip can be surface mount soldered onto a printed circuit board using standard surface mount manufacturing processes. The design for an integrated VCSEL and detector chip fabricated in this manner is described in FIG. 10. It should be noted that methods for designing and fabrication surface mount VCSELs and VCSEL arrays have been disclosed in U.S. Pat. No. 8,675,706 B2 authored by Jean F Seurin et al and issued on Mar. 18, 2014, and co-owned by Princeton Optronics Inc. Mercerville, N.J. That description is being incorporated by reference herein.

Figure 11:
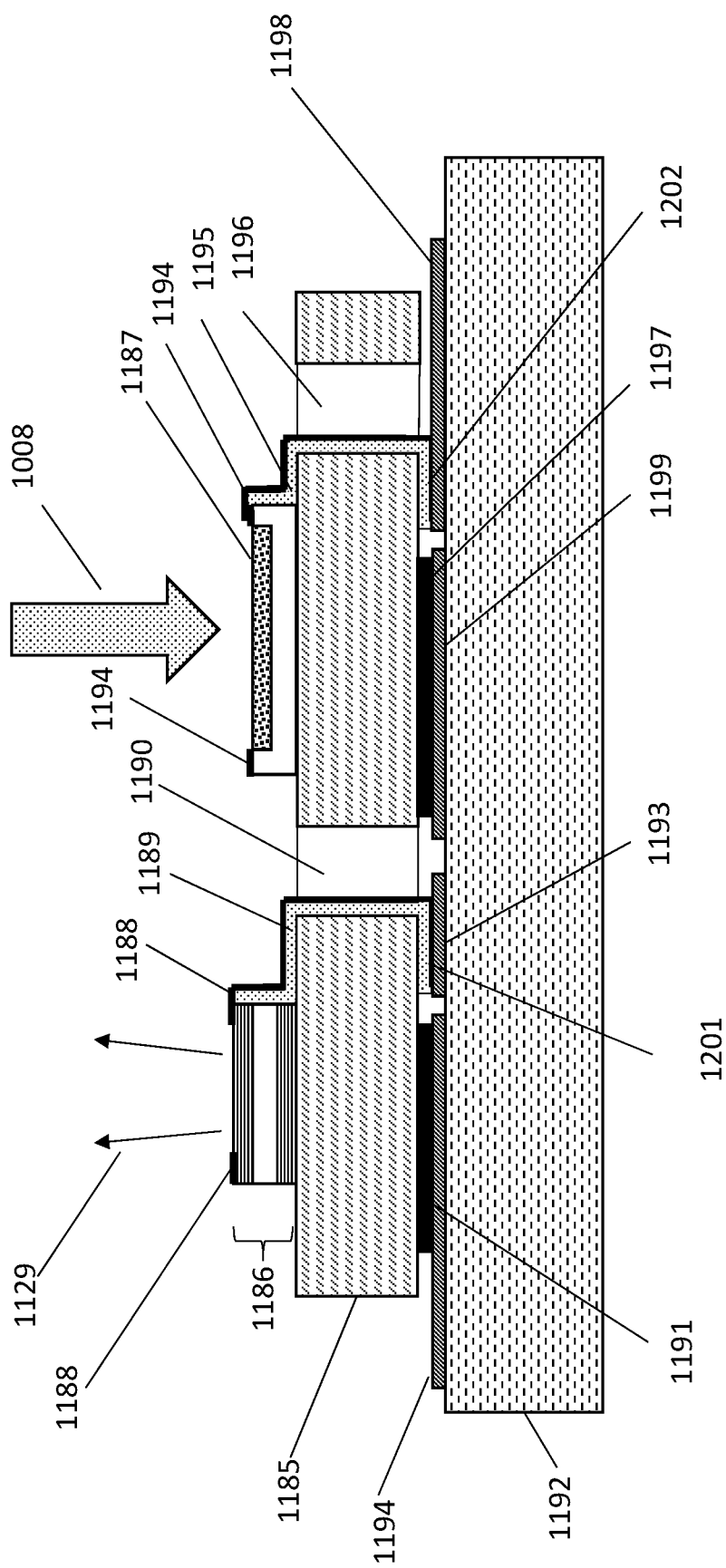
FIG. 11 describes how the integrated VCSEL and detector is fabricated as a single surface mount chip that can be mounted on a ceramic submount or printed circuit board.

The extension of this surface mount technique for incorporating an integrated VCSEL and detector chip is shown in detail in FIG. 11. The VCSEL 1186 and detector 1187 are fabricated in the common substrate 1185. A trench hole 1190 is formed in the substrate and the top contact 1188 of the VCSEL is routed by a conductive lead through the trench to a contact pad 1201 on the bottom side of the substrate. A passivation layer 1189 is deposited between the contact lead and the substrate to provide electrical isolation between them. This provides both VCSEL contacts 1201 and 1191 on the same bottom side of the substrate. These can be used to bond to electrical pads 1193 and 1194 on the PCB 1192 using surface mount processes.

In a similar manner a trench hole 1196 is formed in the substrate beside the detector 1187 and the top contact of the detector 1194 routed by a conductive lead through the trench to the contact pad 1202 on the bottom side of the substrate. A passivation layer 1195 is deposited between the contact lead and the substrate to provide electrical isolation between them. This provides both detector contacts 1202 and 1197 on the same bottom side of the substrate. These can be used to bond to electrical pads 1198 and 1199 on the PCB 1192 using surface mount processes.

The detailed descriptions in this section have been made in relation to proximity sensing of objects for applications such as self-focusing of cameras and other motion detection applications however there are other applications of the technology. The very low divergence VCSEL source beam can also be used for health monitoring by measuring blood flow, heart pulse rate and chemical composition etc. In these applications the source beam is directed at the sample or object and the detector measures quantity of reflected light at one or more wavelengths or fluctuation of reflected light which correlates with pulsing effects from a heart-beat. It is equally important in these other applications that the VCSEL have the same very low divergence properties which have been detailed in the figures and description of the preceding paragraphs. The sensitivity of these applications is equally improved by incorporating the features and elements of this disclosure.

Although a broad framework of the disclosure is described with reference to a few preferred embodiments, other embodiments may be configured by applying combinations and sub-combinations of elements described herein, depending on particular proximity detection or imaging application. Variations and modifications of different embodiments that will be apparent to those skilled in the art. Accordingly, other implementations are within the scope of the claims.

What is claimed is:

1. An optical sensor module comprising:
    an optical source including a VCSEL device including a cavity having a laser gain section between first and second DBR mirrors and a third mirror external to the cavity, the VCSEL device being operable to generate a narrow divergence source beam directed through a protective window toward an object, the narrow divergence source beam having a full-width half-maximum beam divergence of no more than 10 degrees;
    an optical detector to sense light reflected back from the object illuminated by the narrow divergence source beam; and
    a computation device operable to determine a distance to the object or a physical characteristic of the object based at least in part on a signal from the optical detector,
    wherein the laser gain section and the first and second DBR mirrors are mounted on a first side of a substrate and the third mirror is mounted on a second side of the substrate opposite the first side; and
    wherein the substrate includes bonded glass for increasing a thickness of the substrate.

2. The optical sensor module of claim 1 wherein the VCSEL device has multiple gain sections separated from each other by respective tunnel junction diodes.

3. The optical sensor module of claim 2 wherein each of the gain sections is disposed at a location corresponding to a respective maximum intensity point of a resonant cavity standing wave for the VCSEL device.

4. The optical sensor module of claim 2 wherein each of the gain sections is disposed such that a resonant cavity length of each VCSEL device increases in half wavelengths in accordance with the number of gain sections.

5. The optical sensor module of claim 1 wherein the first and second DBR mirrors have a reflectivity such that the VCSEL device would not lase in the absence of the third mirror.

6. The optical sensor module of claim 5 wherein the third mirror includes a partial reflection coating.

7. The optical sensor module of claim 6 having a full-width half-maximum beam divergence of less than 5 degrees.

8. The optical sensor module of claim 1 wherein the VCSEL device includes a converging microlens thereon.

9. The optical sensor module of claim 1 wherein the VCSEL device and the optical detector are integrated in a common substrate that includes trench feedthroughs such that all contacts for the VCSEL device and the optical detector are on a same side for a surface mount assembly.

10. The optical sensor module of claim 1 wherein the optical detector is disposed adjacent an axis of the narrow divergence source beam generated by the VCSEL device.

11. The optical sensor module of claim 1 wherein the VCSEL device and optical detector are on a common substrate.

12. The optical sensor module of claim 11 wherein the VCSEL device is disposed such that the narrow divergence source beam passes through the substrate, and wherein the optical detector is disposed such that light reflected back from the object is detected by the optical detector after passing through the substrate.

13. The optical sensor module of claim 11 wherein the VCSEL device is on a first side of the substrate, and the optical detectors is on a second opposite side of the substrate.

14. The optical sensor module of claim 13 configured such that the optical detector detects light reflected back from the object after the reflected light passes through the substrate.

15. The optical sensor module of claim 13 configured such that the optical detector detects light reflected back from the object after the reflected light passes through a via hole in the substrate.

16. The optical sensor module of claim 1 further including a baffle disposed between the VCSEL devices and the optical detector.

* * * * *